(12) United States Patent
Liao et al.

(10) Patent No.: US 8,796,749 B2
(45) Date of Patent: Aug. 5, 2014

(54) REVERSE CONDUCTIVE NANO ARRAY AND MANUFACTURING METHOD OF THE SAME

(76) Inventors: Shirong Liao, Mira Loma, CA (US); Jinlin Ye, Ontario, CA (US); Bo Liao, Ontario, CA (US); Jie Dong, Ontario, CA (US)

( * ) Notice: Subject to any disclaimer, the term of this patent is extended or adjusted under 35 U.S.C. 154(b) by 133 days.

(21) Appl. No.: 13/586,435

(22) Filed: Aug. 15, 2012

(65) Prior Publication Data
US 2014/0050492 A1    Feb. 20, 2014

(51) Int. Cl.
*H01L 31/0236*    (2006.01)

(52) U.S. Cl.
USPC .......................................................... 257/292

(58) Field of Classification Search
CPC .................................................... H01L 31/062
USPC .......................................................... 257/292
See application file for complete search history.

(56) References Cited

U.S. PATENT DOCUMENTS

| | | | | |
|---|---|---|---|---|
| 4,277,793 A | * | 7/1981 | Webb | 257/436 |
| 4,989,972 A | * | 2/1991 | Braun | 356/225 |
| 5,080,725 A | * | 1/1992 | Green et al. | 136/256 |
| 5,731,213 A | * | 3/1998 | Ono | 438/71 |
| 7,279,731 B1 | * | 10/2007 | Bui et al. | 257/292 |
| 7,759,755 B2 | * | 7/2010 | Adkisson et al. | 257/436 |
| 2011/0129714 A1 | * | 6/2011 | Kelzenberg et al. | 429/111 |
| 2012/0026591 A1 | * | 2/2012 | Hayashibe et al. | 359/601 |

* cited by examiner

*Primary Examiner* — Robert Carpenter
(74) *Attorney, Agent, or Firm* — Che-Yang Chen; Law Office of Michael Chen

(57) ABSTRACT

A high-speed photodiode may include a photodiode structure having a substrate, a light-absorbing layer and a light-directing layer that is deposited on a top surface of the photodiode structure and patterned to form a textured surface used to change the angle of incident light to increase a light path of the incident light when entering the photodiode structure. In one embodiment, the light-directing layer may include a plurality of polygon such as triangular projections to refract the incident light to increase the light path thereof when entering the photodiode structure. In another embodiment, a plurality of nanoscaled sub-triangular projections can patterned on both sides of each triangular projection to more effectively increase the light paths. In a further embodiment, porous materials can be used to form the light-directing layer.

15 Claims, 12 Drawing Sheets

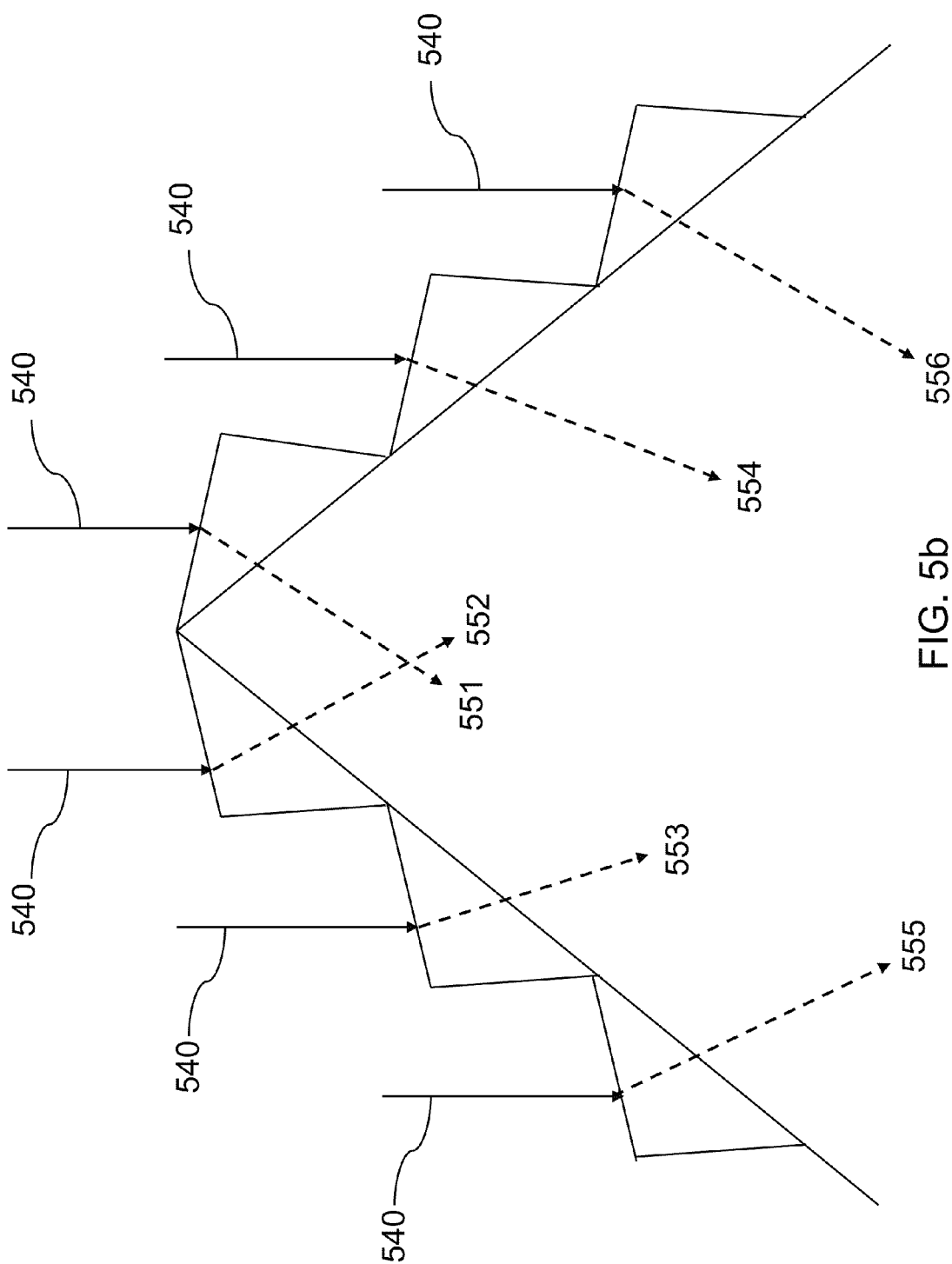

REVERSE CONDUCTIVE NANO ARRAY AND MANUFACTURING METHOD OF THE SAME

FIELD OF THE INVENTION

The present invention relates to opto-electronic devices, and more particularly to a high-speed photodiode having high absorption efficiencies without compromising the speed of the photodiode.

BACKGROUND OF THE INVENTION

Over the past few decades, photodiodes have been utilized in the areas including military, communication, information technology and energy. Photodiodes are operated by absorbing photons or charged particles to generate a flow of current in an external circuit, proportional to the incident power. In other words, photodiodes primarily have two functions: the absorption and conversion of light to an electrical signal, and the amplification of that electrical signal through multiplication.

The application of photodiodes in optical telecommunication can be seen in FIG. 1, where an electrical signal is converted into an optical signal at a transmitting end and then transmitted through an optical transmission line, such as an optical fiber. The converted optical signal is converted back to an electrical signal at a receiving end using a light-receiving element, such as a photodiode or photodetector.

Silicon photodiodes are semiconductor devices responsive to high energy particles and photons. A standard type is the PIN diode that basically includes an intrinsic semiconductor light-absorbing layer sandwiched between n-type and p-type semiconductor layers. As shown in FIG. 2, a PIN diode 200 may include a cathode 210, an n-doped region 220, an intrinsic light-absorbing layer 230, a p-doped region 240, and an anode 250. When incident light 270 comes in, most photons are absorbed in the intrinsic layer 230, and carriers generated therein can efficiently contribute to the photocurrent. The most common PIN diodes are based on silicon, and they are sensitive throughout the visible spectral region and in the near infrared up to the wavelength of 1 μm. InGaAs PIN diodes are available for longer wavelengths up to 1.7 μm. In addition, the PIN diode may have an anti-reflecting coating layer 260 on top of the p-doped region 240.

An avalanche photodiode (APD) is another type of photodetector that exploits the photoelectric effect to convert light to electricity. Different from conventional PIN diodes, incoming photons trigger an internal charge avalanche in APDs, which may generate an internal current gain effect (around 100) due to this avalanche effect. As shown in FIG. 2a, a SACM (separate absorption, charge and multiplication) APD structure 200' may include at least an absorption layer 210', a charge layer 220' and a multiplication layer 230', where the charge layer 220' provides a sufficient electric filed drop between the absorption layer 210' and the multiplication layer 230' to secure effective avalanche multiplication.

The performance of the photodiodes is based on the achievable signal processing speed and noise, which are dependent on the absorption efficiencies. FIG. 3 shows a simplified photodiode structure 310 with a thickness d, and the simplified structure 310 may include all layers in the PIN diode 200 shown in FIG. 2 or the APD 200' in FIG. 2a. When incident light passes through the diode structure 310, a light path length merely equals to the thickness of the structure d. The light path generally refers to the distance that an unabsorbed photon may travel within the device before it escapes out of the device. Without increasing the light path inside the diode structure 310, the absorption efficiency is considered low. To enhance the absorption efficiency, some people proposed to increase the thickness of the light-absorbing layer, however, it limits the transit time of electrons and holes generated by the incident light and thus reduce the speed of the photodiode. Therefore, there remains a need for a new and improved photodiode having high absorption and multiplication efficiencies and high speed to overcome the problems stated above.

SUMMARY OF THE INVENTION

It is an object of the present invention to provide a high-speed photodiode device with high absorption efficiencies by increasing the light path of the incident light.

It is another object of the present invention to provide a high-speed photodiode device having a light-directing layer with a micro/nano-textured surface to change the angle of the incident light, and further increase the light path thereof.

It is a further object of the present invention to provide a high-speed photodiode device having a light-directing layer with a micro/nano-textured surface that includes a plurality of triangles, sub-triangles on the triangles, polygon-shaped projections, diamond-shaped projections, cone-shaped projections, or any combination of abovementioned shapes.

It is still a further object of the present invention to provide a PIN diode employing a light-directing layer with a micro/nano-textured surface to change the angle of the incident light, and further increase the light path thereof.

It is still a further object of the present invention to provide an avalanche photodiode (APD) employing a light-directing layer with a micro/nano-textured surface to change the angle of the incident light, and further increase the light path thereof.

In one aspect, a high-speed photodiode comprises a photodiode structure that includes a substrate, a light-absorbing layer, a charge layer and a multiplication layer; and a light-directing layer that is deposited on a top surface of the photodiode structure and patterned to form a textured surface used to change the angle of incident light to increase a light path of the incident light when entering the photodiode structure. In another aspect, the high-speed photodiode may be a PIN diode, which includes a substrate, an intrinsic light-absorbing layer and two contact layers.

In one embodiment, the light-directing layer may include a textured pattern such as a plurality of triangular projections to refract the incident light to increase the light path thereof when entering the photodiode structure, and the material of the triangular projections includes InP, GaAs, Si, Ge, InGaAs and InGaAsP. Furthermore, an increased light path can be obtained as $d(\sec(\theta-\theta_2)-1)$, where d is thickness of the photodiode absorption layer, $\theta$ is an incident angle of the incident light, and $\theta_2$ is a refractive angle of refracted light.

In another embodiment, a plurality of sub-triangular projections may be patterned on both sides of each triangular projection using nanolithography instruments including contact aligners, steppers or E-beam lithography. Furthermore, the incident light can be arranged to totally reflect in the triangular projection to significantly increase the light path when the refractive index of the sub-triangular projection is higher than the refractive index of corresponding triangular projection.

In a further embodiment, the light-directing layer is made by porous materials, and the incident light is deflected inside the porous material to increase the light path when entering the photodiode structure. It is noted that the incident light may be deflected more than one time in the porous material.

In another aspect, an optical communication system may include a transmitter, an optical fiber optically connecting to the transmitter, and an optical receiver optically coupled to the optical fiber. The optical receiver may include a high-speed photodiode having a photodiode structure including a substrate, a light-absorbing layer, a charge layer and a multiplication layer; and a light-directing layer that is deposited on a top surface of the photodiode structure and patterned to form a textured surface used to change the angle of incident light to increase a light path of the incident light when entering the photodiode structure.

BRIEF DESCRIPTION OF THE DRAWINGS

FIGS. 5a and 5b illustrate a schematic view of the incident light passing through the light-directing layer in FIG. 5.

DETAILED DESCRIPTION OF THE INVENTION

The detailed description set forth below is intended as a description of the presently exemplary device provided in accordance with aspects of the present invention and is not intended to represent the only forms in which the present invention may be prepared or utilized. It is to be understood, rather, that the same or equivalent functions and components may be accomplished by different embodiments that are also intended to be encompassed within the spirit and scope of the invention.

Unless defined otherwise, all technical and scientific terms used herein have the same meaning as commonly understood to one of ordinary skill in the art to which this invention belongs. Although any methods, devices and materials similar or equivalent to those described can be used in the practice or testing of the invention, the exemplary methods, devices and materials are now described.

All publications mentioned are incorporated by reference for the purpose of describing and disclosing, for example, the designs and methodologies that are described in the publications that might be used in connection with the presently described invention. The publications listed or discussed above, below and throughout the text are provided solely for their disclosure prior to the filing date of the present application. Nothing herein is to be construed as an admission that the inventors are not entitled to antedate such disclosure by virtue of prior invention.

As stated above, speed is one of the key factors to determine the performance of photodiodes, especially when the photodiode is utilized in high-speed optical communication systems. The speed of the photodiode primarily depends on the absorption and multiplication efficiencies, which can be enhanced by changing the incident angle of the incident light to enable the light to travel a longer distance inside the photodiode, or using some "light-trapping" features to enable the light to bounce back and forth many times inside the photodiode.

Figure 4:
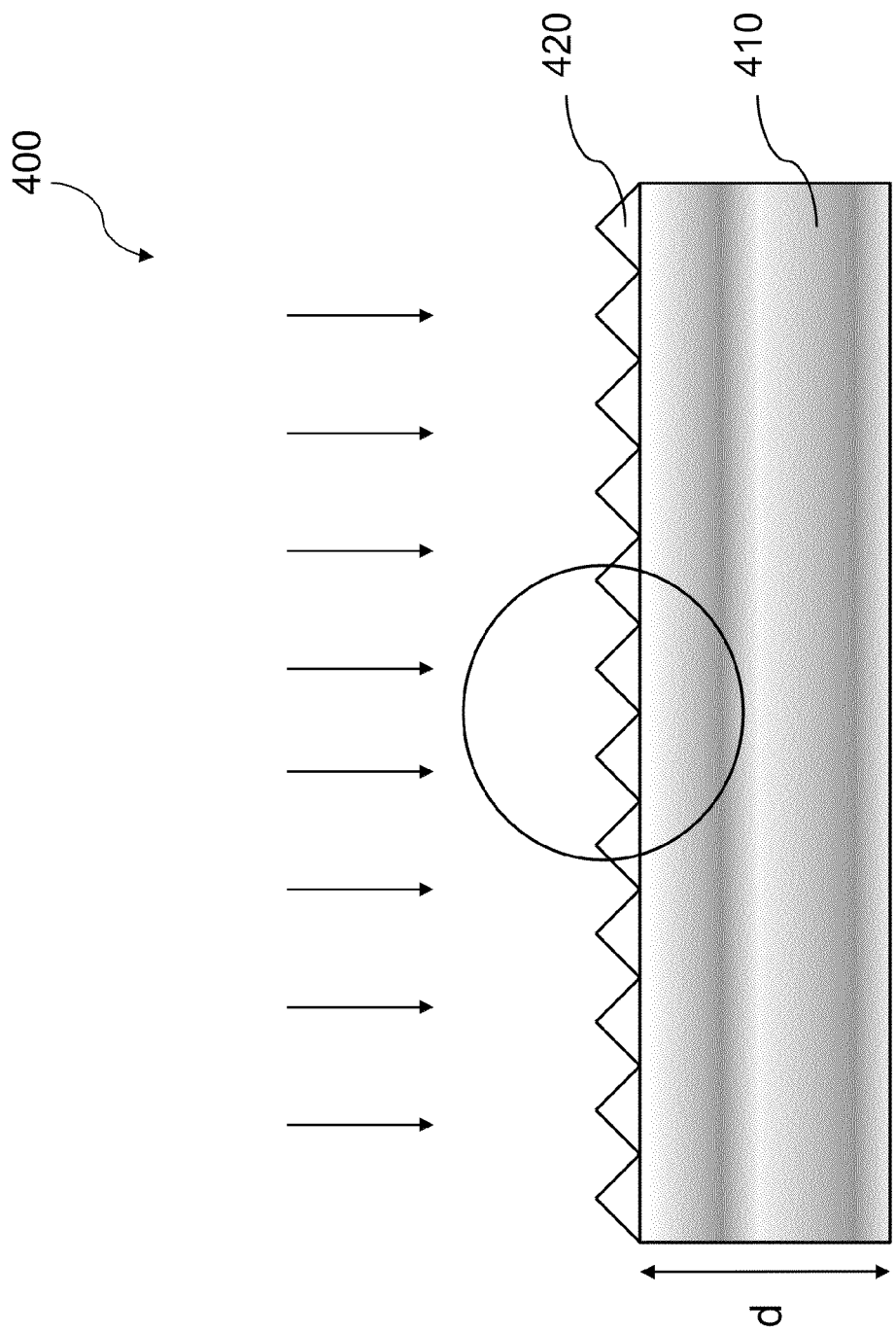
FIG. 4 illustrates one embodiment having a light-directly layer on the diode structure in the present invention.

In one aspect of the present invention, a high-speed photodiode 400 may include a diode structure 410 and a light-directing layer 420 that is disposed on top of the diode structure 410, as shown on FIG. 4. In one embodiment, the high-speed photodiode 400 may be a PIN diode such as the PIN diode 200. In another embodiment, the high-speed photodiode 400 may be an avalanche photodiode (APD). The substrate of the high-speed photodiode can be silicon, germanium, Si/Ge material system, $Si/Si_xGe_{1-x}$ material system, InP/InGaAs material system or InP/InGaAsP material system, according to the wavelength of the incident light.

In an exemplary embodiment, the light-directing layer 420 is deposited on top of the diode structure 410 and patterned to form a plurality of triangular projections with a facet angle θ. The size of the each triangle can range from a few micrometers to a few hundred nanometers or even smaller. The triangles can be formed by wet etching or other etching techniques in semiconductor fabrication process. As discussed above, the absorption efficiency of the photodiode can be enhanced by changing the incident angle of the incident light to increase the light path inside the photodiode. As can be see in FIG. 4a focusing on light reflection/refraction, when an incident light 430 is being incident on an angled surface of the light-directing layer 420, the incident light 430 is refracted into the triangular projection of the light-directing layer 420 to generate a refracted light 440 entering the diode with a specific angle to travel a longer distance (than the thickness d) in the diode structure 410. In other words, the light path of the incident light 430 increases to enhance absorption and multiplication efficiencies, and further enhance the speed of the photodiode 400. It is noted that the projections of the light-directing layer 420 are not limited to triangles or sub-triangles on the triangles. The projections can be polygon-shaped, diamond-shaped, cone-shaped, or any combination of above-mentioned shapes.

Figure 4A:
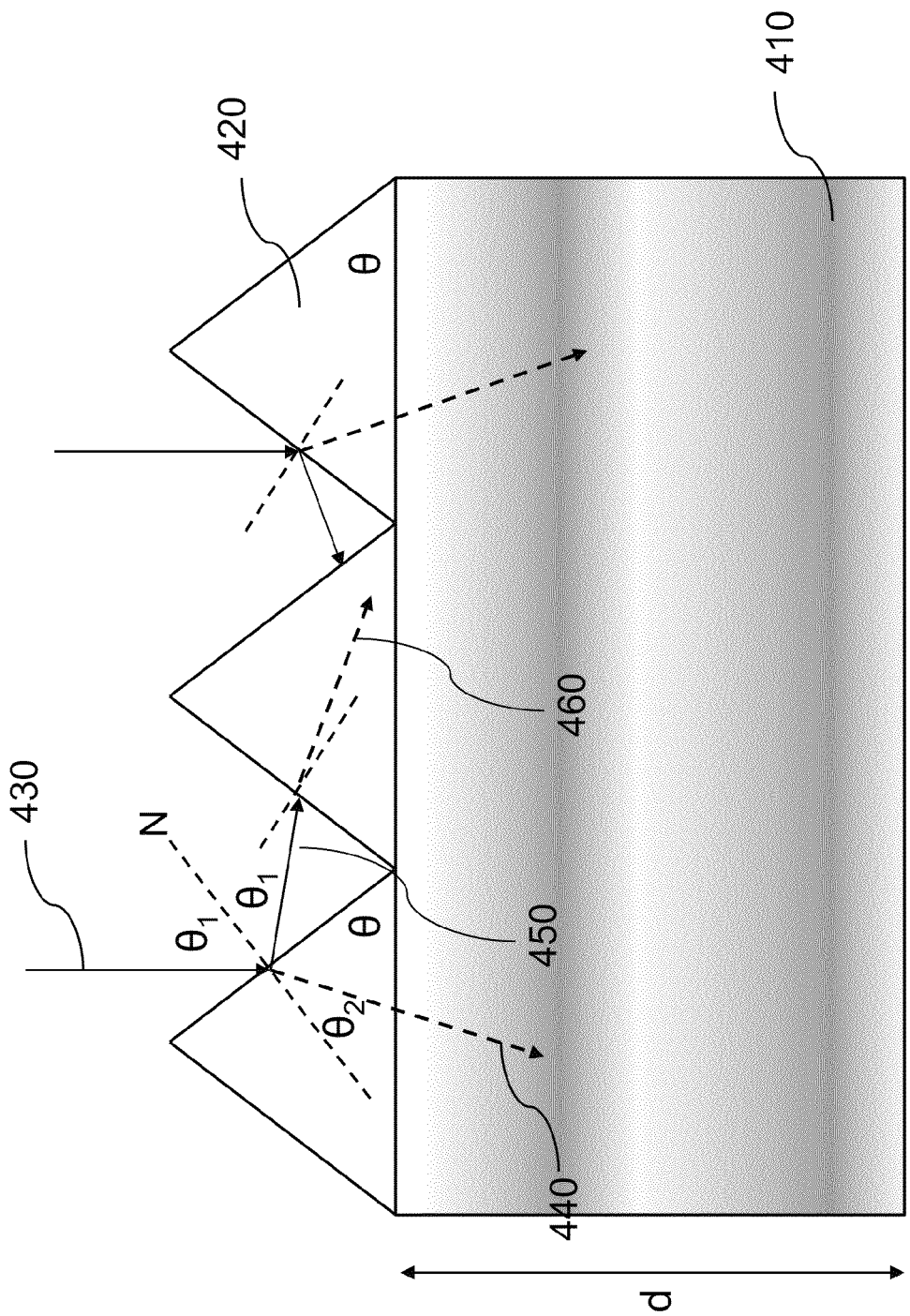
FIGS. 4a and 4b illustrate a schematic view of the incident light passing through the light-directing layer in the present invention.

According to Snell's law, the ratio of sines of the angles of incidence and refraction is equivalent to the opposite ratio of the indices of refraction of the two media, which can be expressed as:

$$n_1 \sin\theta_1 = n_2 \sin\theta_2$$

where $\theta_1$ and $\theta_2$ are the angles of incidence and refraction, which is measured relative to the normal plane N of the interface, while $n_1$ and $n_2$ are the refractive indices of the incident and refractive media, as shown in FIG. 4a. In one embodiment, the material of the light-directing layer 420 can be, but not limited to InP, GaAs, Si, Ge, InGaAs, InGaAsP. If the incident medium is air (refractive index about 1) and the refractive medium is silicon (refractive index about 3.97), the relationship between the incidence and refraction angles becomes $\sin\theta_1 = 3.97 \sin\theta_2$, and if the incidence angle $\theta_1$ is known, the refractive angle $\theta_2$ can be obtained accordingly.

Still referring to FIG. 4a, the incident light 430 can not only be refracted, but reflected to another triangular projection. A reflected light 450 can be considered the incident light of another triangular projection, and a second refracted light 460 can be generated, and enters the diode structure 410 with a longer light path. However, the magnitude of the refracted light 460 may be attenuated due to multiple reflection and refraction, and it may not be as effective (regarding electron/hole generation) as the first refracted light 440.

Figure 4B:
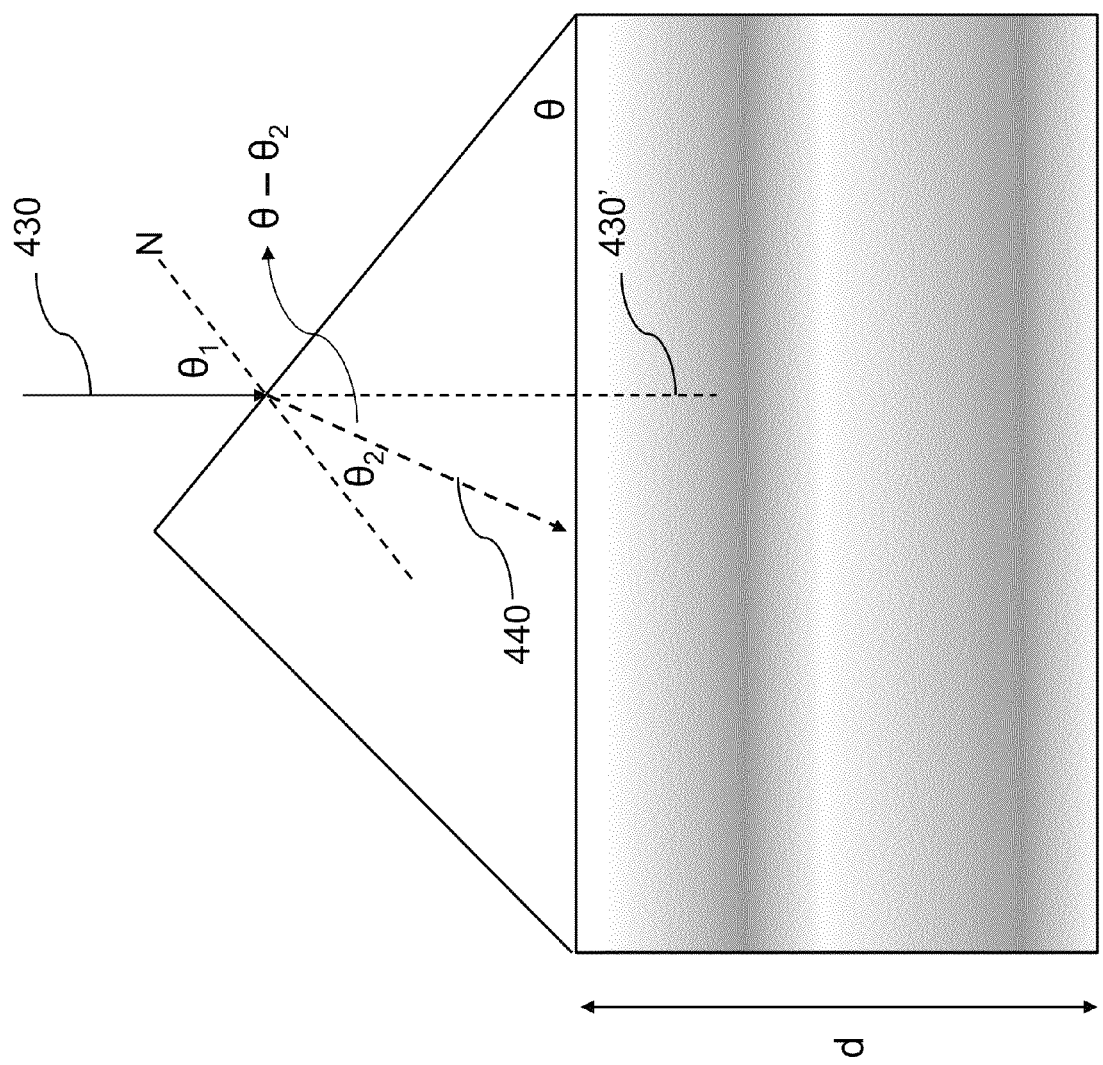

As illustrated in FIG. 4b, the increased light path can be obtained using simple geometric calculations. A dash line 430' can be drawn from point where the incident light 430 interfaces with the angled surface, and an angle ($\theta-\theta_2$) is formed between the dashed line 430' and the refracted light 440. Therefore, the light path after the incident light 430 is being refracted is d sec($\theta-\theta_2$), and the increased light path is d(sec($\theta-\theta_2$)−1), and the light absorption efficiency of the diode is thus increased by sec($\theta-\theta_2$). For example, if the refractive index of the light-directing layer 420 is 3.1, the refractive angle is about $\theta/3$, and the increased light path is $$d\left(\sec\left(\frac{2}{3}\theta\right)-1\right).$$

It is noted that the incident angle $\theta_1$ is equal to the facet angle $\theta$ of the triangular projection.

Figure 1:
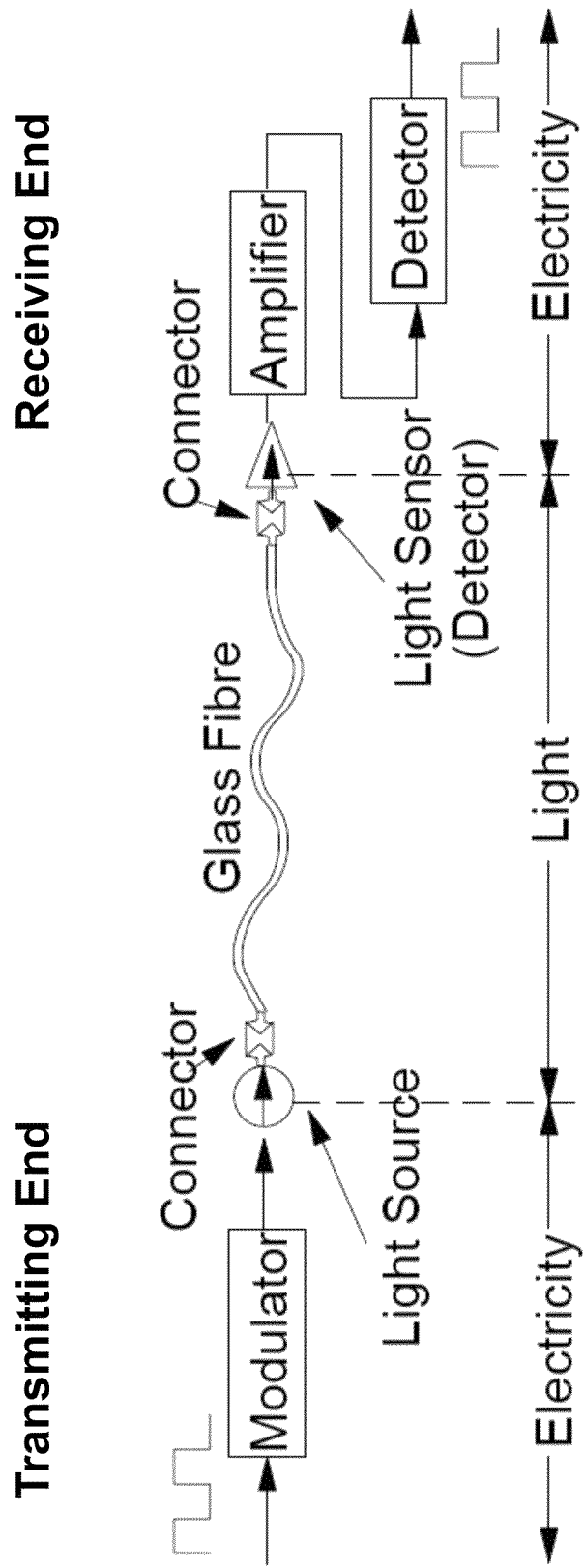
FIG. 1 illustrates an application of photodiodes in optical telecommunication.
Figure 2:
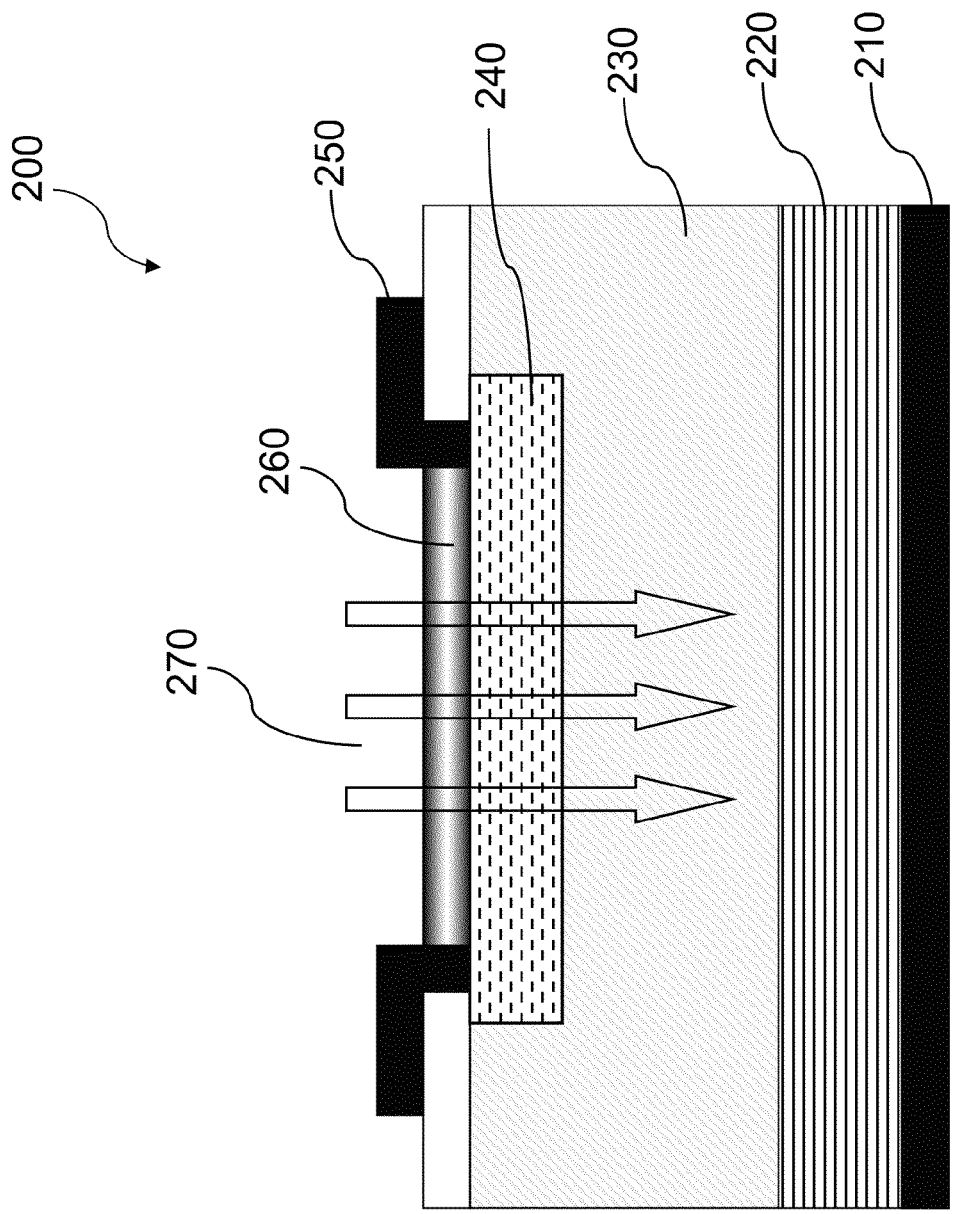
FIG. 2 illustrates a conventional PIN diode structure.
Figure 2A:
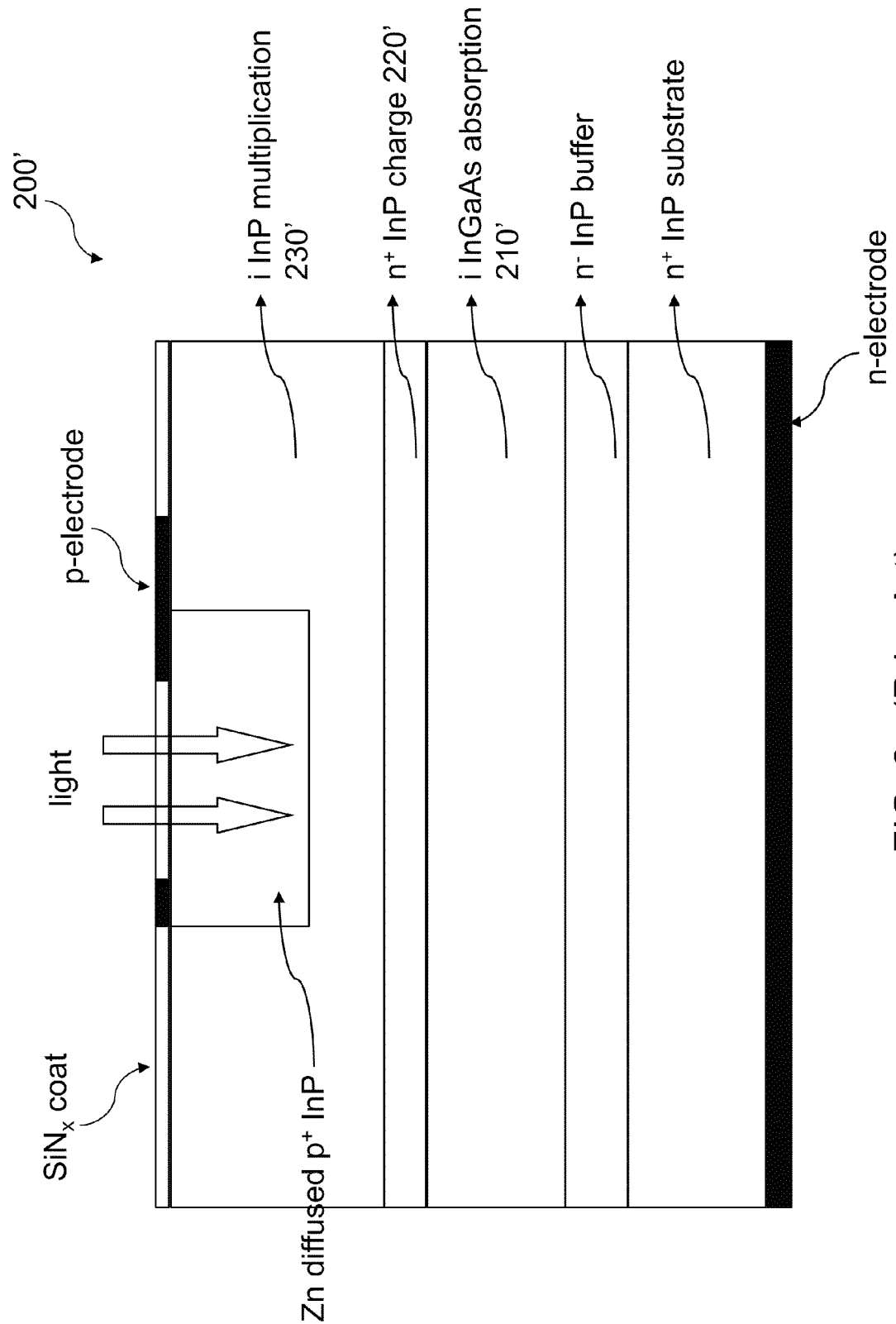
FIG. 2a illustrates a conventional APD structure.
Figure 3:
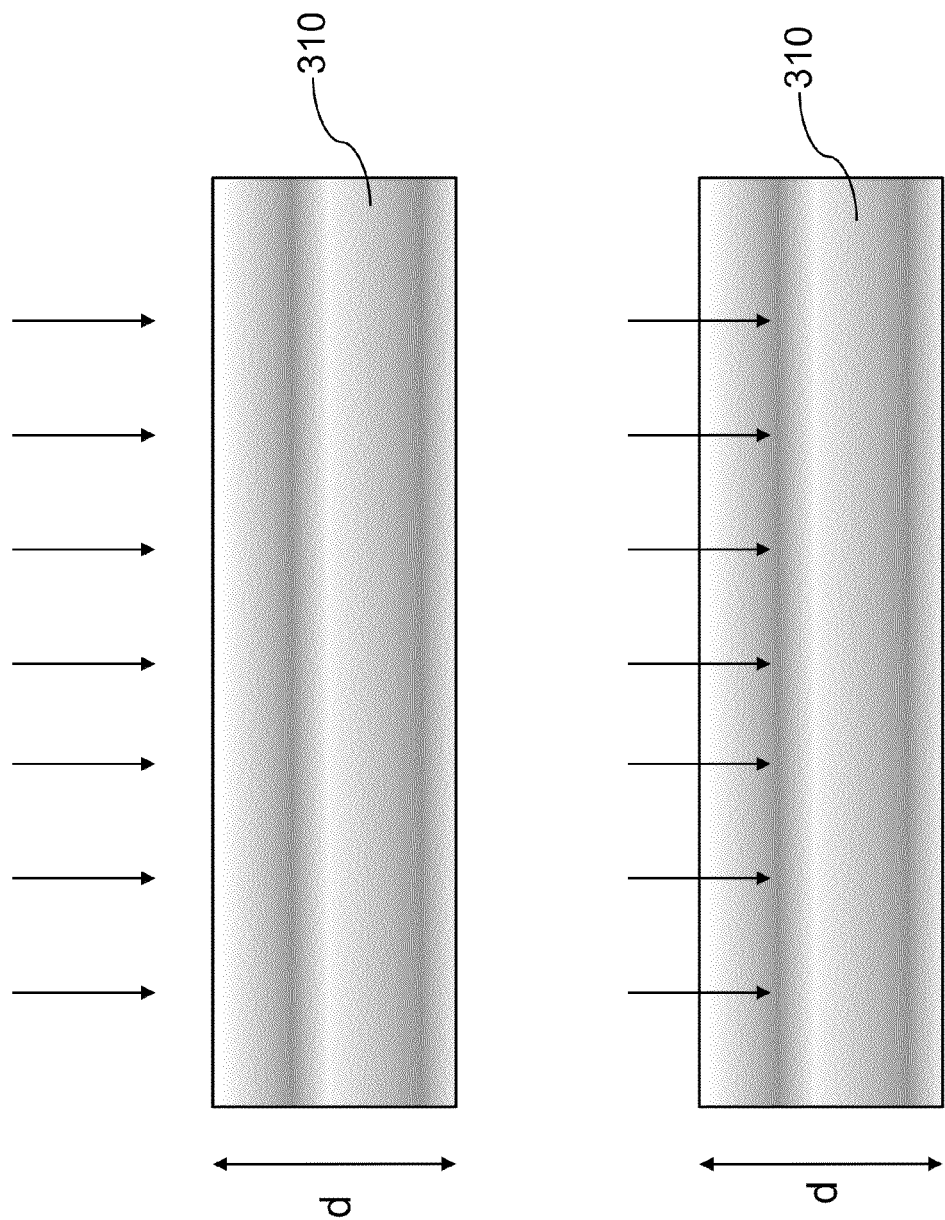
FIG. 3 illustrates a simplified photodiode structure where the incident light passes through the photodiode structure and the light path equals to the thickness of the photodiode.
Figure 5:
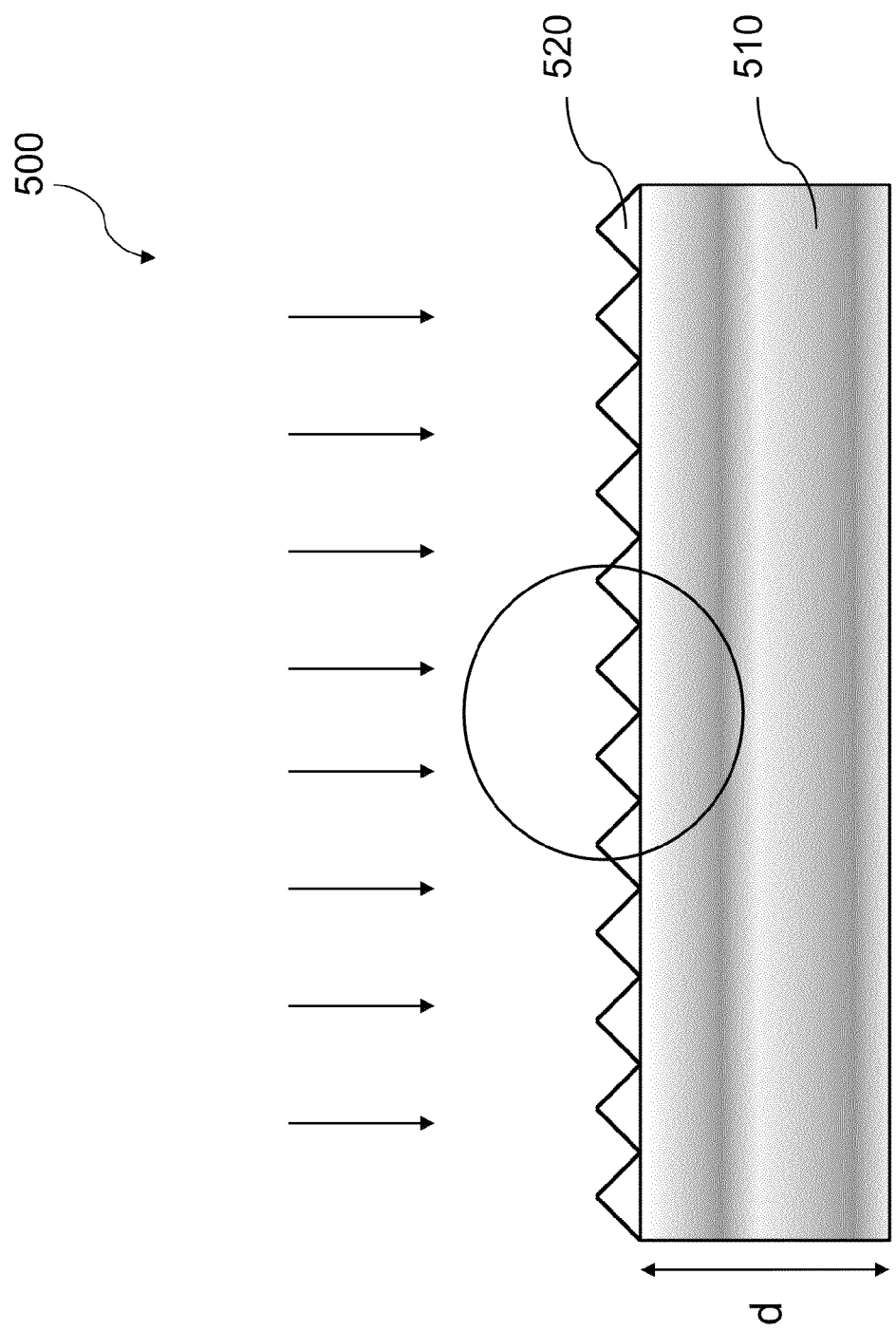
FIG. 5 illustrates another embodiment having a plurality of sub-triangular projections on the light-directing layer on the diode structure in the present invention.

In another embodiment, a high-speed photodiode 500 may include a diode structure 510 and a light-directing layer 520 that is disposed on top of the diode structure 510, as shown on FIG. 5. Likewise, the high-speed photodiode 500 may be an APD 200' shown in FIG. 2a or a PIN diode 200 shown in FIG. 2. The substrate of the high-speed photodiode can be silicon, germanium, Si/Ge material system, Si/Si$_x$Ge$_{1-x}$ material system, InP/InGaAs material system or Inp/InGaAsP material system according to the wavelength of the incoming light.

Figure 5A:
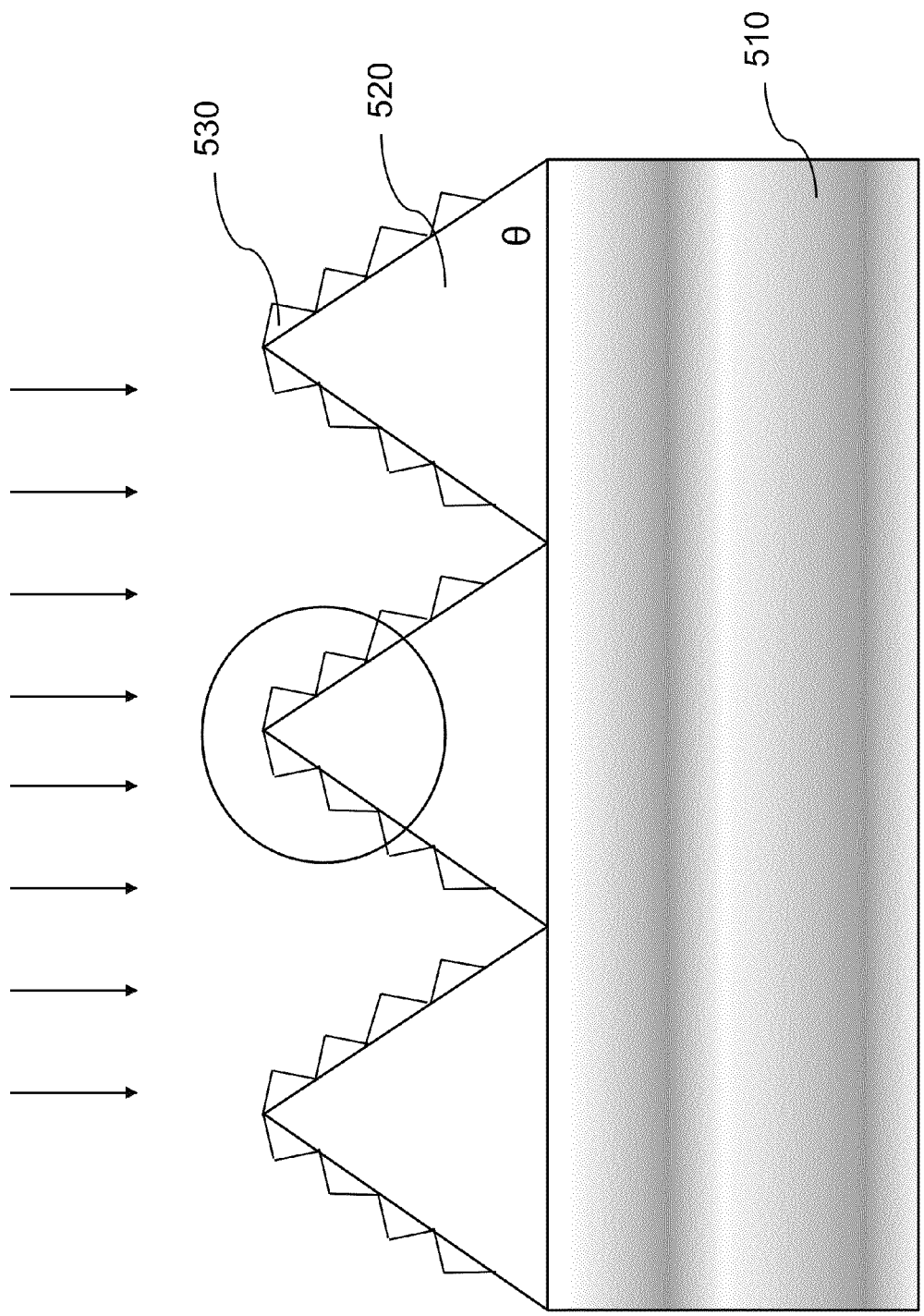

While the light-directing layer 520 is similar to the light-directing layer 420 having a plurality of triangular projections, the light-directing layer 520 has a number of sub-triangular projections 530 on both sides of each triangular projection as shown in FIG. 5a. As discussed above, the triangular projections in the light-directing layer 520 can be formed by wet etching or other applicable semiconductor etching techniques, and the size thereof ranges from a few hundred micrometers to a few hundred nanometers. The sub-triangular projections 530, which are even smaller than the triangular projections in the light-directing layer 520, can be generated by nanolithography instruments, such as contact aligners, steppers or E-beam lithography.

Comparing with the light-directing layer 420, the light-directing layer 520 with "nano-textured" sub-triangular projections 530 has much more angled surfaces to refract the incident light 540 to generate more refracted light (such as 551 to 556) with different refractive angles to effectively increase the light paths as shown in FIG. 5b. Since the angle of refracted light can be controlled by the facet angle of the sub-triangular projections 530 as discussed above, the light path can be optimized either individually or collectively to effectively increase the electron/hole generation and further enhance the performance of the photodiode. In a further embodiment, if the incident light 540 passes from a high refractive index medium to a low refractive index medium, there is a possibility of total internal reflection. Namely, the incident light 540 can be trapped inside and make multiple travels to significantly increase the light path. For example, if the sub-triangular projection 530 is made by a material with a higher refractive index than the material used for the triangular projection, total internal reflection can be arranged to achieve when the incident light 540 passes from the sub-triangular projections 530 to the triangular projection.

Figure 6:
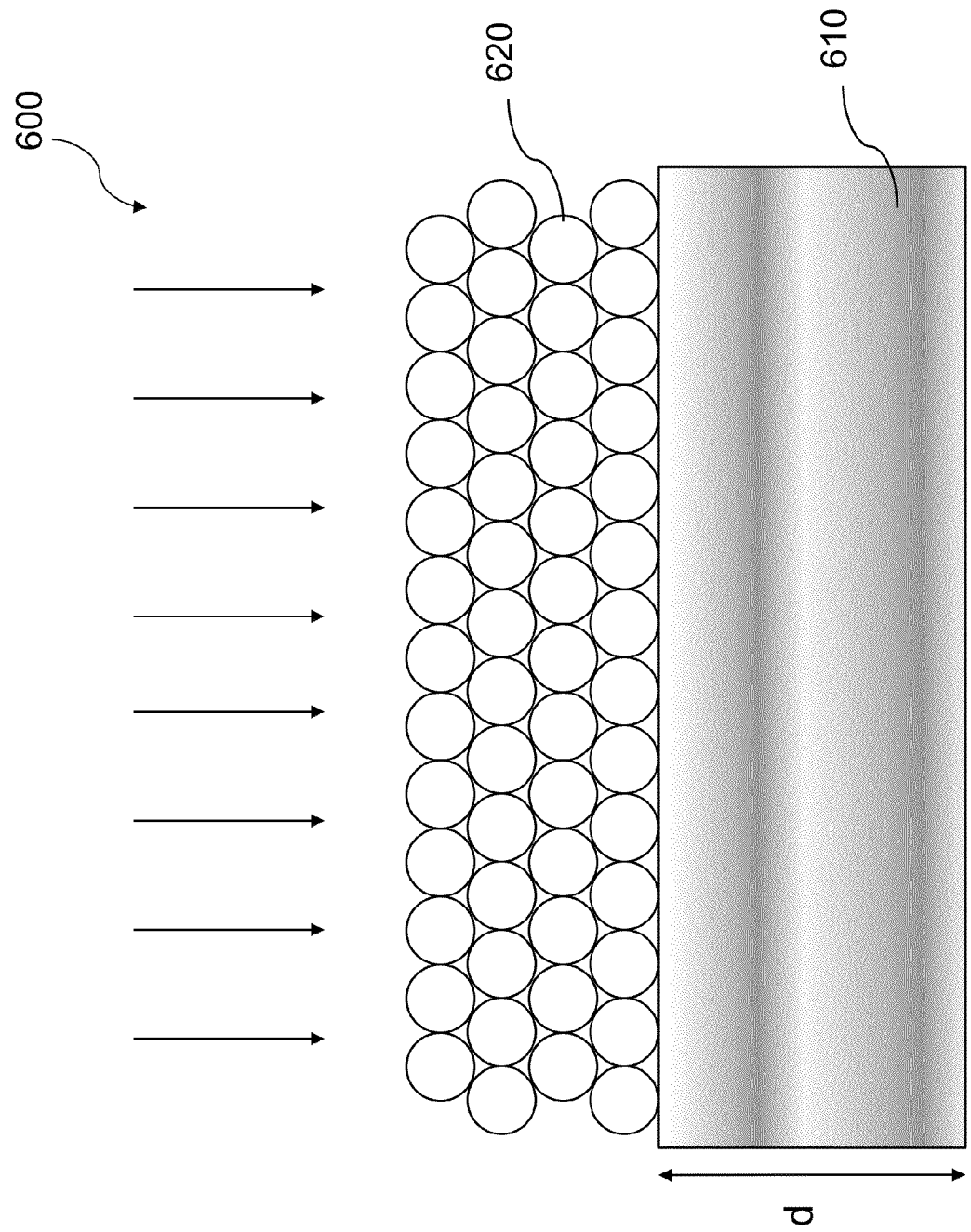
FIG. 6 illustrates a further embodiment having a porous structure as the light-directing layer on the diode structure in the present invention.
Figure 6A:
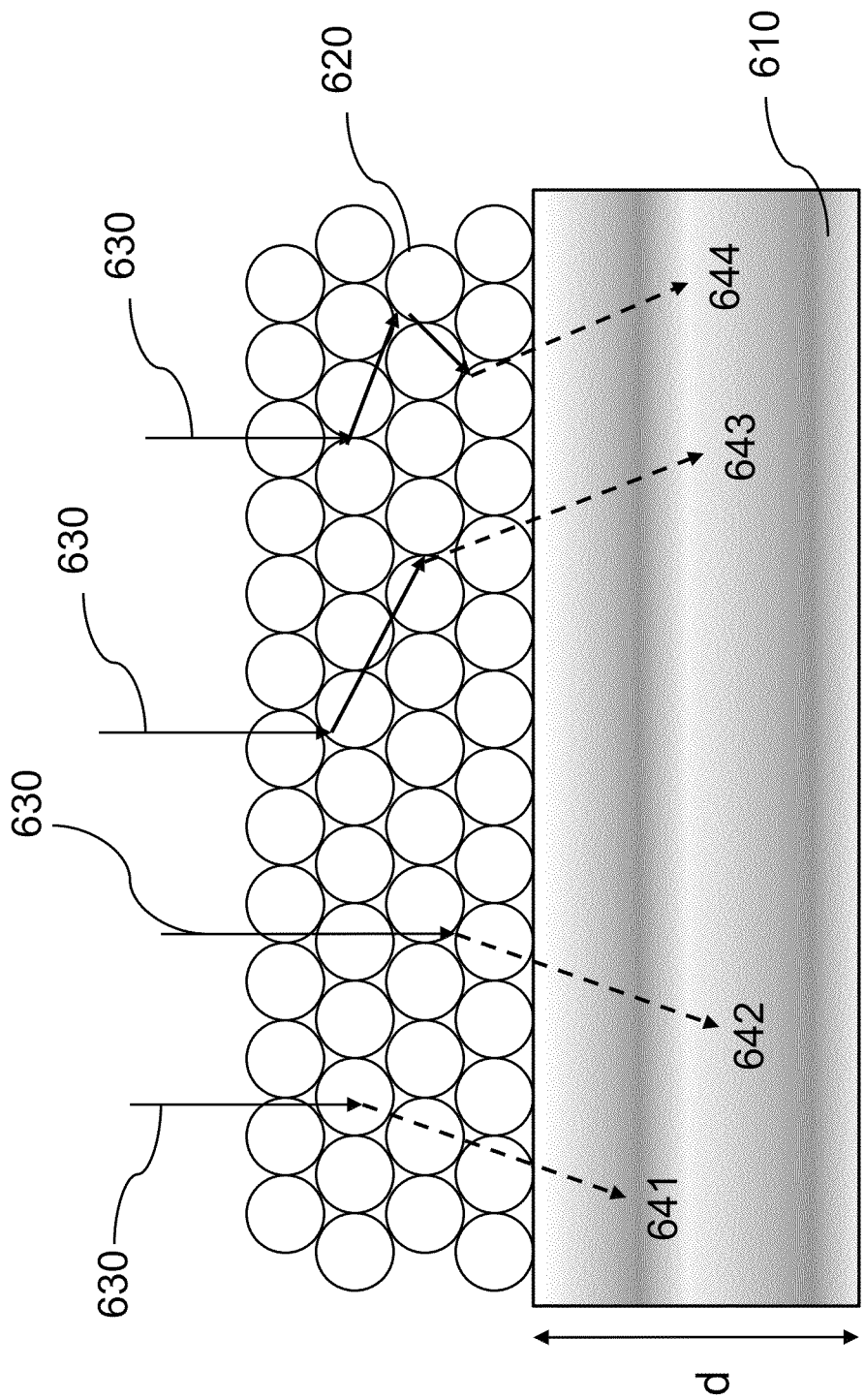
FIG. 6a illustrates a schematic view of the incident light passing through the porous light-directing layer in FIG. 6.

A porous material is a material containing pores. The skeletal portion of the porous material is usually a solid, but structures like foams. In still a further embodiment shown in FIG. 6, a photodiode 600 has a diode structure 610 and a porous light-directly layer 620 patterned on top of the diode structure 610. As can be seen in FIG. 6b, when the incident light 630 passes through the porous, the incident light 630 can be deflected to change the angle and further increase the light path (such as 641 and 642) when entering the diode structure 610. Moreover, the incident light 630 may be deflected more than once in the porous structure (such as 643 and 644) before entering the diode structure 610.

Having described the invention by the description and illustrations above, it should be understood that these are exemplary of the invention and are not to be considered as limiting. Accordingly, the invention is not to be considered as limited by the foregoing description, but includes any equivalent.

What is claimed is:

1. A photodiode comprising:
   a diode structure including a substrate, and a light-absorbing layer; and
   a light-directing layer including a plurality of polygon projections that is deposited on a top surface of the diode structure and patterned to form a textured surface used to change the angle of incident light to increase a light path of the incident light when entering the diode structure,
   wherein the polygon projections include a plurality of triangular and sub-triangular projections, and said sub-triangular projections are patterned on both sides of each triangular projection.

2. The photodiode of claim 1, wherein the material of the polygon projections includes InP, GaAs, Si, Ge, InGaAs and InGaAsP.

3. The photodiode of claim 1, wherein the polygon projections are formed by wet etching or other etching techniques in semiconductor fabrication process.

4. The photodiode of claim 1, wherein an increased light path is d(sec($\theta-\theta_2$)−1), where d is thickness of the photodiode absorption layer, $\theta$ is an incident angle of the incident light regarding a triangular projection, and $\theta_2$ is a refractive angle of refracted light.

5. The photodiode of claim 1, wherein using nanolithography instruments including contact aligners, steppers or E-beam lithography are used to pattern said sub-triangular projections on both sides of each triangular projection.

6. The photodiode of claim 1, wherein the incident light is arranged to totally reflect in the triangular projection only when the refractive index of the sub-triangular projection is higher than the refractive index of corresponding triangular projection.

7. The photodiode of claim 1, wherein the light-directing layer is made by porous materials, and the incident light is deflected inside the porous material to increase the light path when entering the diode structure.

8. The photodiode of claim 1, wherein the diode structure further comprises a charge layer and a multiplication layer.

9. An optical communication system comprising a transmitter, an optical fiber optically connecting to said transmitter, and an optical receiver optically coupled to the optical fiber, said optical receiver including a photodiode comprising:
   a diode structure including a substrate, and a light-absorbing layer; and
   a light-directing layer that is deposited on a top surface of the diode structure and patterned to form a textured surface used to change the angle of incident light to increase a light path of the incident light when entering the diode structure, wherein the textured surface includes a plurality of triangular and sub-triangular projections, and said sub-triangular projections are patterned on both sides of each triangular projection.

10. The optical communication system of claim 9, wherein the material of the textured surface includes InP, GaAs, Si, Ge, InGaAs and InGaAsP.

11. The optical communication system of claim 9, wherein an increased light path is $d(\sec(\theta-\theta_2)-1)$, where d is thickness of the diode structure, $\theta$ is an incident angle of the incident light regarding said triangular projection, and $\theta_2$ is a refractive angle of refracted light.

12. The optical communication system of claim 9, nanolithography instruments including contact aligners, steppers or E-beam lithography are used to pattern said sub-triangular projections on both sides of each triangular projection.

13. The optical communication system of claim 9, wherein the incident light is arranged to totally reflect in the triangular projection only when the refractive index of the sub-triangular projection is higher than the refractive index of corresponding triangular projection.

14. The optical communication system of claim 9, wherein the light-directing layer is made by porous materials, and the incident light is deflected inside the porous material to increase the light path when entering the diode structure.

15. The optical communication system of claim 9, wherein the diode structure further comprises a charge layer and a multiplication layer.

\* \* \* \* \*